(12) United States Patent
Rao et al.

(10) Patent No.: US 12,272,408 B2
(45) Date of Patent: Apr. 8, 2025

(54) PARTIAL BLOCK READ LEVEL VOLTAGE COMPENSATION TO DECREASE READ TRIGGER RATES

(71) Applicant: Micron Technology, Inc., Boise, ID (US)

(72) Inventors: Nagendra Prasad Ganesh Rao, Folsom, CA (US); Paing Z. Htet, Union City, CA (US); Sead Zildzic, Jr., Folsom, CA (US); Thomas Fiala, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 132 days.

(21) Appl. No.: 18/138,489

(22) Filed: Apr. 24, 2023

(65) Prior Publication Data

US 2023/0368845 A1  Nov. 16, 2023

Related U.S. Application Data

(60) Provisional application No. 63/340,059, filed on May 10, 2022.

(51) Int. Cl.
*G11C 7/00* (2006.01)
*G11C 16/08* (2006.01)
*G11C 16/10* (2006.01)
*G11C 16/26* (2006.01)

(52) U.S. Cl.
CPC .............. *G11C 16/26* (2013.01); *G11C 16/08* (2013.01); *G11C 16/102* (2013.01)

(58) Field of Classification Search
CPC ....... G11C 7/1051; G11C 7/22; G11C 7/1072; G11C 7/1006; G11C 7/1066
USPC ....................................... 365/189.15, 189.14
See application file for complete search history.

(56) References Cited

U.S. PATENT DOCUMENTS

2018/0358098 A1* 12/2018 Cha ................... G11C 16/3495

\* cited by examiner

*Primary Examiner* — Son T Dinh
(74) *Attorney, Agent, or Firm* — Lowenstein Sandler LLP

(57) ABSTRACT

A memory device includes a memory array having a plurality of wordlines coupled with respective memory cells of the memory array. Control logic is operatively coupled with the memory array, the control logic to perform operations including: determining, prior to performing a read operation at one or more strings of the respective memory cells, a number of wordlines that are associated with memory cells that have been programmed; adjusting, based on the number of wordlines, a read level voltage for a selected wordline of the one or more strings that is to be read during the read operation; and causing, during the read operation, the adjusted read level voltage to be applied to the selected wordline.

18 Claims, 11 Drawing Sheets

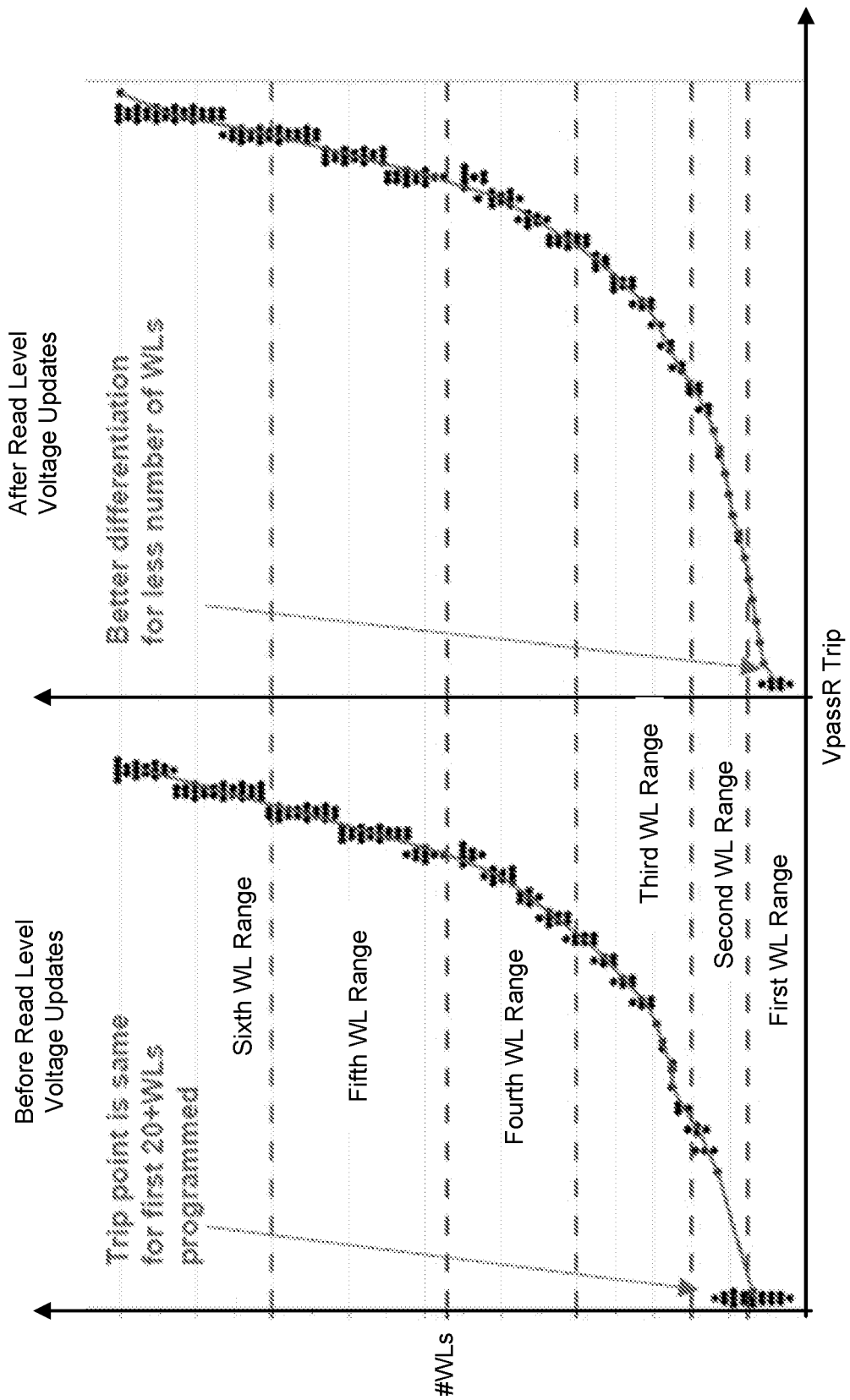

700

```
┌─────────────────────────────────────────────────┐
│ Determine, prior to performing a read operation │
│ at string(s) of memory cells of a memory array, │
│ a number of wordlines of the string(s) that are │
│ associated with memory cells that have been     │
│ programmed.                                     │
│ 710                                             │
└─────────────────────────────────────────────────┘
                        │
                        ▼
┌─────────────────────────────────────────────────┐
│ Adjust, based on the number of wordlines, a     │
│ read level voltage associated with a selected   │
│ wordline of the string(s) that is to be read    │
│ during the read operation.                      │
│ 720                                             │
└─────────────────────────────────────────────────┘
                        │
                        ▼
┌─────────────────────────────────────────────────┐
│ Cause, during the read operation, the adjusted  │
│ read level voltage to be applied to the         │
│ selected wordline.                              │
│ 730                                             │
└─────────────────────────────────────────────────┘
```

FIG. 7

PARTIAL BLOCK READ LEVEL VOLTAGE COMPENSATION TO DECREASE READ TRIGGER RATES

REFERENCE TO RELATED APPLICATION

This application claims the benefit of U.S. Provisional Patent Application No. 63/340,059, filed May 10, 2022, the entirety of which is incorporated herein by reference.

TECHNICAL FIELD

Embodiments of the disclosure are generally related to memory sub-systems, and more specifically, relate to partial block read level voltage compensation to decrease read trigger rates.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 6A is a graph illustrating a typical memory array in which a pass voltage trip point is the same for many of the initial wordlines (WLs) associated with programmed memory cells and that increases rapidly with an increasing number of memory cells that are programmed according to at least one embodiment.

FIG. 6B is a graph illustrating results of the disclosed read partial block level voltage compensation in which the pass voltage trip point has better differentiation for respective WLs associated with the memory cells that are initially programmed according to an embodiment.

FIG. 7 is a flow diagram of an example method of performing partial block read level voltage compensation according to various embodiments.

DETAILED DESCRIPTION

Figure 1A:
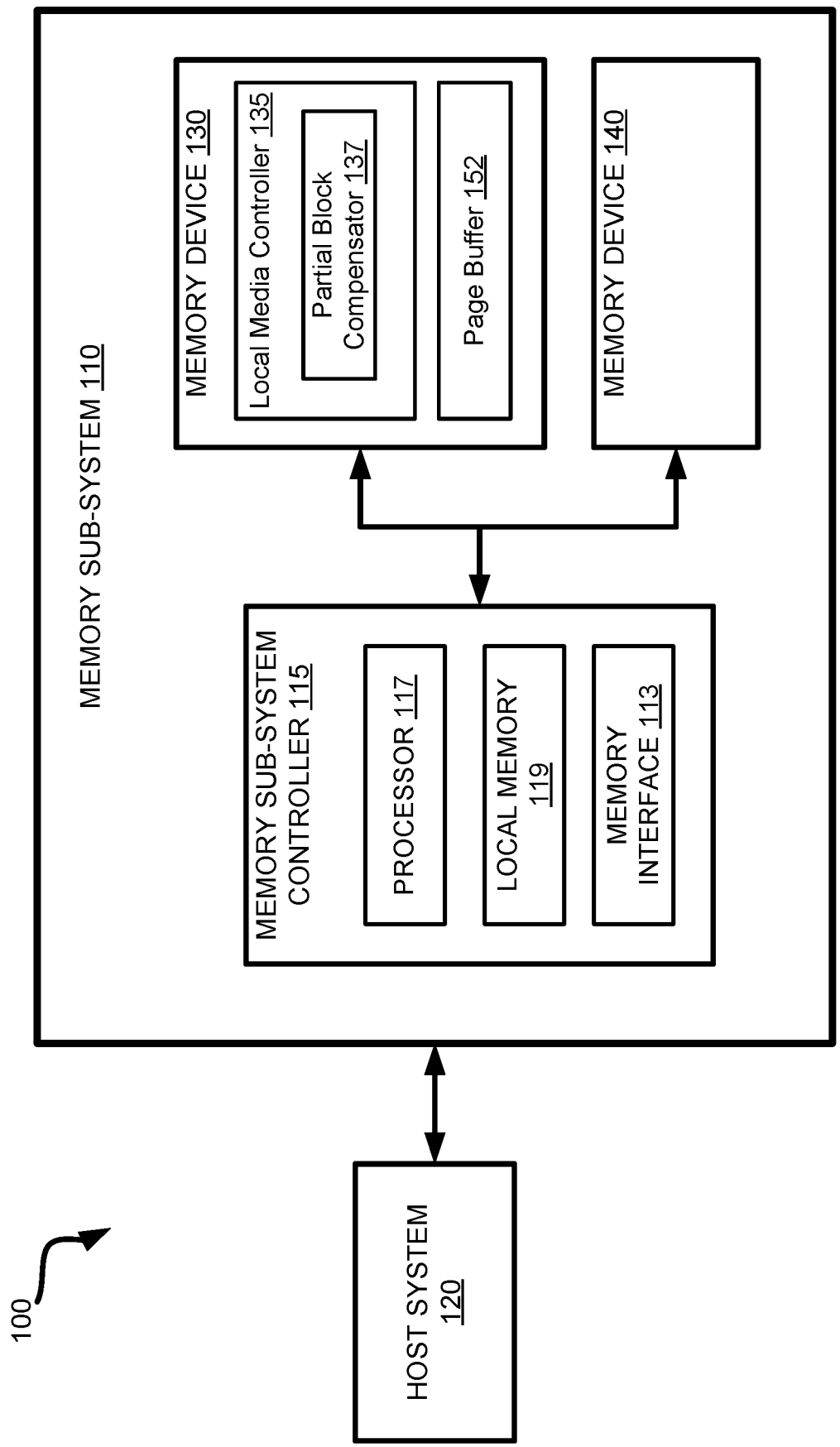
FIG. 1A illustrates an example computing system that includes a memory sub-system in accordance with some embodiments.

Embodiments of the present disclosure are directed to performing partial block read level voltage compensation to decrease read trigger rates. One or more memory devices can be a part of a memory sub-system, which can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1A. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines (WLs) and bitlines (BLs), such that a wordline joins multiple memory cells forming a row of the matric of memory cells, while a bitline joins multiple memory cells forming a column of the matric of memory cells.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory, one or more portions where the sub-blocks are configured as multi-level cell (MLC) memory that can store two bits of information per cell, (triple-level cell) TLC memory that can store three bits of information per cell, and/or one or more portions where the sub-blocks are configured as quad-level cell (QLC) memory that can store four bits per cell. The voltage levels of the memory cells in TLC memory form a set of 8 programming distributions representing the 8 different combinations of the three bits stored in each memory cell. Depending on how the memory cells are configured, each physical memory page in one of the sub-blocks can include multiple page types. For example, a physical memory page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical memory page formed from memory cells of the QLC memory type can have a total of four logical pages, where each logical page can store data distinct from the data stored in the other logical pages associated with that physical memory page, which is herein referred to as a "page."

A memory device typically experiences random workloads, which can impact the threshold voltage (Vt) distributions, which can be shifted to higher or lower values. A temporal voltage shift, for example can include a quick charge loss (QCL) that occurs soon after programming and a slow charge loss (SCL) that occurs as time passes during data retention. In order to compensate for various threshold voltage (Vt) distribution shifts, calibration operations can be performed in order to adjust the read level voltages, which can be done on a distribution-by-distribution basis, as higher Vt levels tend to incur more temporal voltage shift than do lower Vt levels. In certain memory devices, read level voltage adjustments can be performed based on values of one or more data state metrics obtained from a sequence of read and/or write operations. In an illustrative example, the data state metric can be represented by a raw bit error rate (RBER), which is the ratio of the number of erroneous bits to the number of all data bits stored in a certain portion of the memory device (e.g., in a specified data block). In these memory devices, sweep reads can be performed in order to create RBER/log likelihood ratio (LLR) profiles to error correction coding (ECC) and select the most efficient profile. Such calibrations can be performed so as to accurately predict where valleys are located between Vt distributions for purposes of accurately reading data from the memory cells.

Further, such memory devices also typically experience a back-pattern effect of a physical block of memory cells that causes an intrinsic change in threshold voltage (Vt) across the memory cells, causing each Vt level to be sensed at lower voltages. A back-pattern effect is experienced in partially-programmed blocks (e.g., "partial blocks") of memory cells and most strongly experienced in scenarios with the most empty physical blocks. The back-pattern effect can be understood, therefore, as an overdrive of current within a channel or pillar of a memory array within the physical block due to a pass voltage (Vpass) applied to unselected WLs of memory cells of the array that are not programmed. Although initially applied to all WLs, this pass voltage generally remains applied to unselected WLs during a read operation to ensure the associated memory cells remain conducting (turned on) along the pillar. This back-pattern effect impacts all Vt distributions of the memory array and is thus not compensated for via the above Vt distribution-based calibration techniques that endeavor to adjust for Vt distribution (e.g., temporal voltage) shifts.

In reading partial blocks that experience this back-pattern effect, the memory device also experiences a high read trigger rate, even those in which calibration techniques are employed to address the Vt of temporal voltage shifts. A read trigger rate corresponds to a number of read operations that, due to incurring a high raw bit error rate (RBER) during reading the data, triggers additional read error handling operations. This high read trigger rate has been observed in partially-programmed blocks regardless of how long after programming the read operation is performed and whether or not programming was performed at a different temperature than the later read operation. The read trigger rate can correspond to the probability that a code word fails hard decode, impacting system performance and quality of service (QoS). More specifically, if a codeword fails a hard bit read, error recovery flow will be triggered that negatively impacts QoS. Partial block usage can be evident in storage applications for mobile, embedded storage, storage (consumer, client, datacenter devices) or external customers. This back-pattern effect can be expected to worsen with future technology of memory devices as the number of WLs per block and/or per sub-block increases.

Aspects of the present disclosure address the above and other deficiencies through determining, prior to performing a read operation at one or more strings of memory cells of a memory array, the number of wordlines that are associated with memory cells that have been programmed. This determination can be performed at the memory device or at a memory sub-system controller in different embodiments, as will be explained. The memory device can then adjust a read level voltage, based on the number of wordlines, for a selected wordline of the one or more strings that is to be read (e.g., sensed) during the read operation. The memory device can further cause, during the read operation, the adjusted read level voltage to be applied to the selected wordline.

In an alternative embodiment, the memory sub-system controller can perform the read level voltage adjustment on behalf of the memory device. For example, the controller can identify the number of wordlines of a block of memory cells of the memory array that are associated with memory cells that have been programmed. The controller can further determine a voltage offset corresponding to the number of wordlines and determine a read level voltage using the voltage offset. In disclosed embodiments, this read level voltage is optimized to minimize RBER and thus the read trigger rates. The controller can then send a read command to the memory device that includes the adjusted read level voltage and an address of a selected wordline of the memory array that is to be read. In this way, when the memory device acts on the memory command, the memory device retrieves the read level voltage that relies on the voltage offset. In either of the memory device or system-level embodiments, additional read level voltage calibrations (e.g., to compensate for temporal voltage shifts of Vt distributions) can be additionally performed and added to a total voltage offset for the particular read operation, e.g., that might be specific to a Vt distribution.

Therefore, advantages of the systems and methods implemented in accordance with some embodiments of the present disclosure include, but are not limited to, reducing the read trigger rates associated with partially-programmed blocks. This reduction in read trigger rates is expected to improve the quality of service (QoS) that users will experience in accessing data during read operations. Other advantages will be apparent to those skilled in the art of read performance optimization in operating memory devices, which will be discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In at least one embodiment, memory device 130 includes a memory access manager configured to carry out memory access operations, e.g., in response to receiving memory access commands from memory interface 113. In some implementations, local media controller 135 includes at least a portion of memory access manager and is configured to perform the functionality described herein. In some implementations, the memory access manager is implemented on memory device 130 using firmware, hardware components, or a combination of the above. In an illustrative example, the memory access manager receives, from a requestor, such as memory interface 113, a request to read a data page of the memory device 130. A read operation can include a series of read strobes, such that each strobe applies a certain read level voltage to a chosen wordline of a memory device 130 in order to compare the estimated threshold voltages $V_T$ of a set of memory cells to one or more read level voltages corresponding to the expected positions of the voltage distributions of the memory cells.

In some embodiments, the memory device 130 includes a page buffer 152, which can provide the circuitry used to program data to the memory cells of the memory device 130 and to read the data out of the memory cells. In some embodiments, control logic of the local media controller 135 includes a partial block compensator 137 that can implement or direct the read operations that include partial block read compensation and other related operations herein. In some embodiments, this control logic is integrated in whole or in part within the memory sub-system controller 115 and/or the host system 120.

Figure 1B:
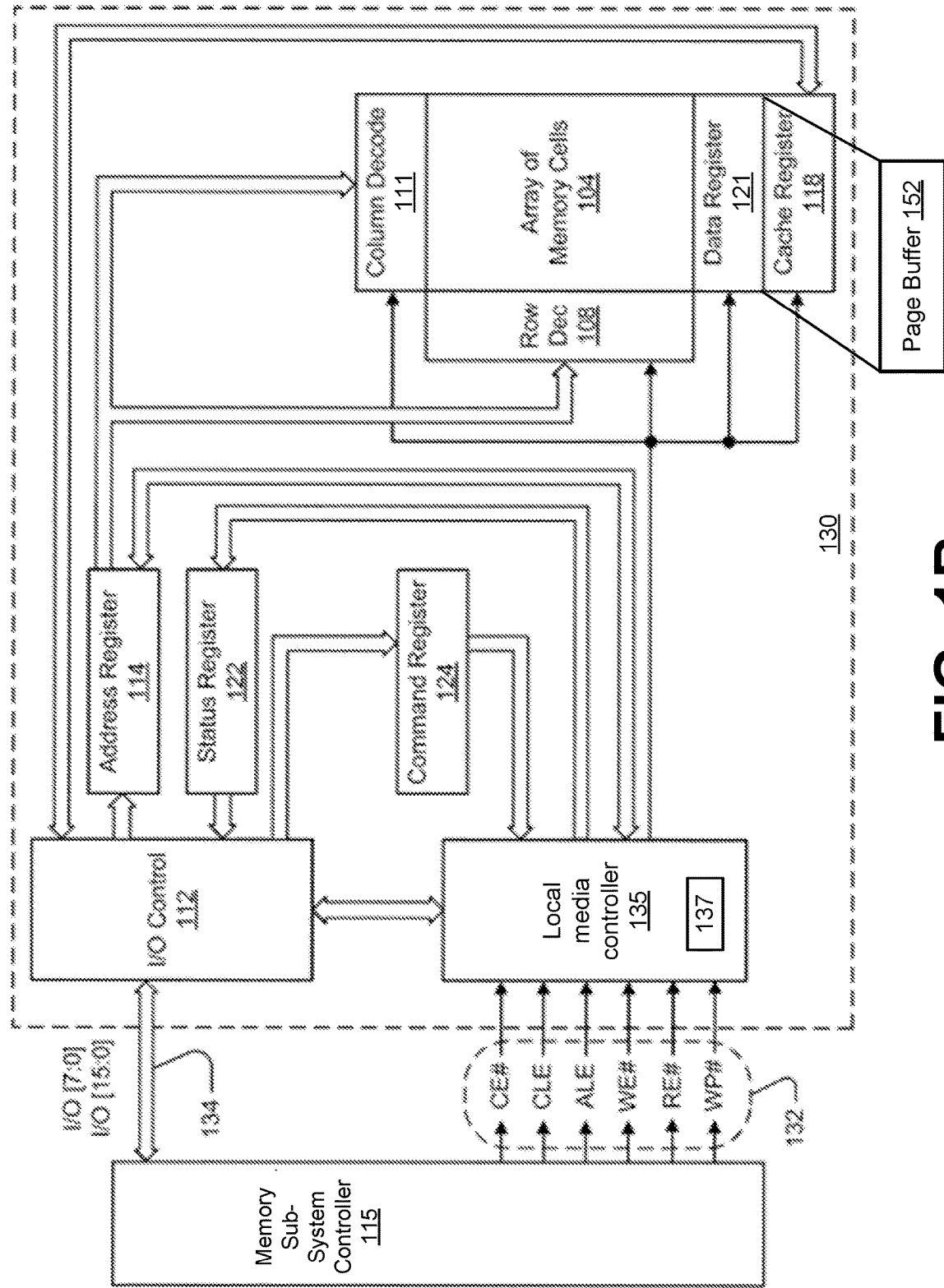
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffer 152 of the memory device 130. The page buffer 152 can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
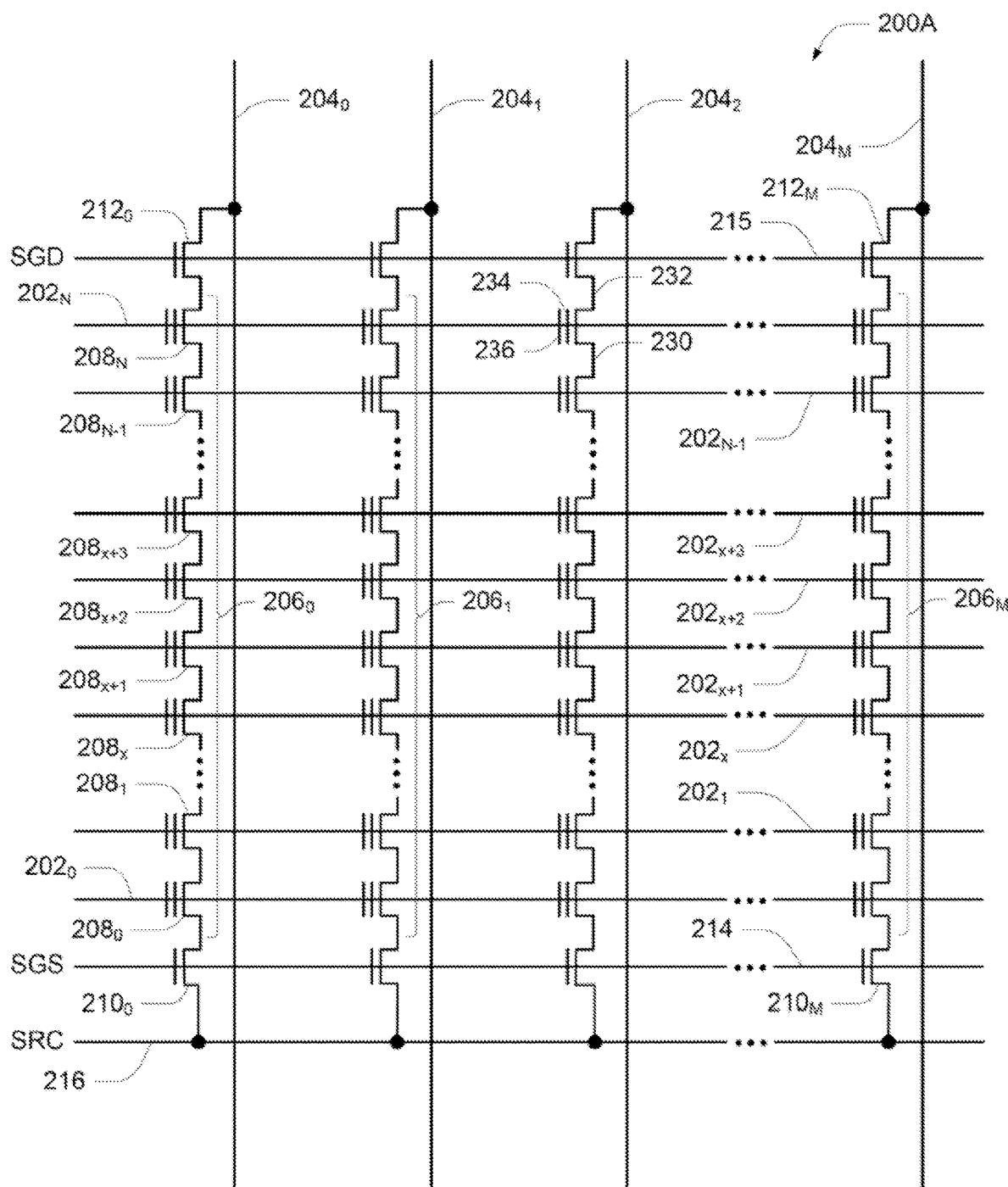
FIG. 2A-2B are schematics of portions of an array of memory cells as could be used in a memory of the type described with reference to FIG. 1B according to an embodiment.
Figure 2B:
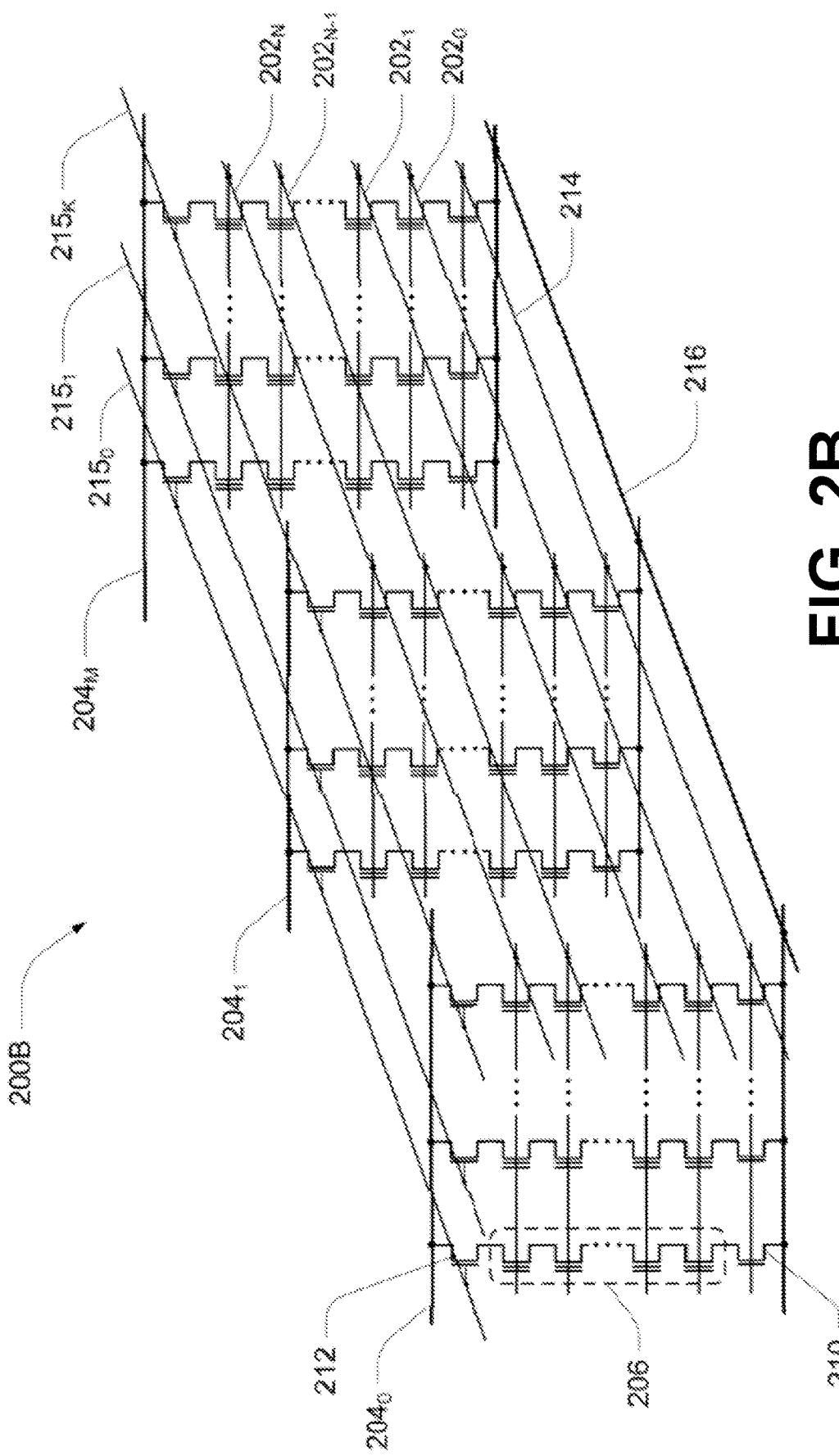

FIG. 2A-2B are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200A in FIG. 2A can be a quasi-two-dimensional memory array and can have a generally planar structure, e.g., where the common source 216, NAND strings 206 and bit lines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2A, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bit line $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. In some embodiments, each sub-block or string of memory cells has a separate select line 214 from other sub-blocks or strings. In some embodiments, a pair of sub-blocks shares a select line 214. Each word line 202 can be connected to multiple rows of memory cells of the memory array 200B. Rows of memory cells that are commonly connected to each other by a particular word line 202 can collectively be referred to as tiers.

Figure 3:
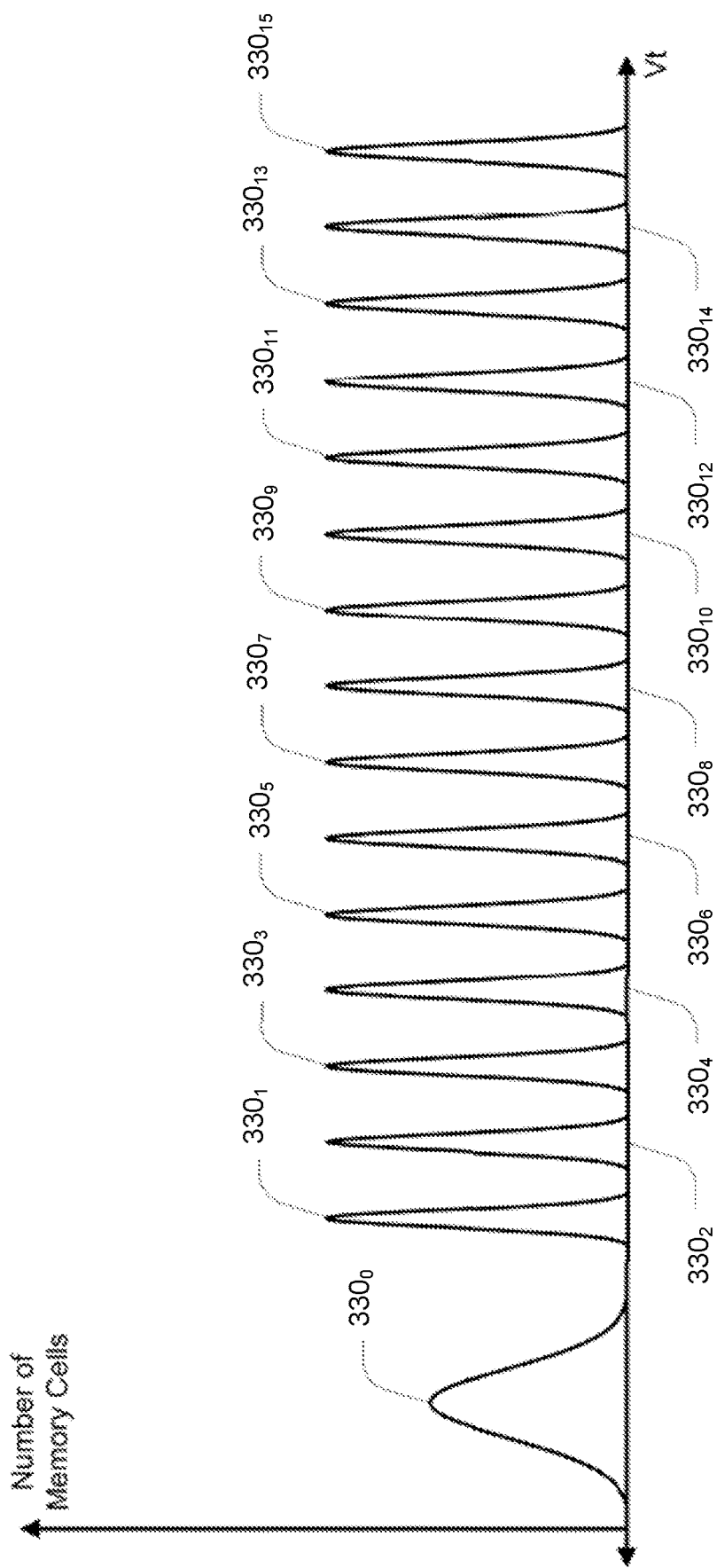
FIG. 3 is a conceptual depiction of threshold voltage distributions of multiple memory cells of a memory array according to an embodiment.

FIG. 3 is a conceptual depiction of threshold voltage ranges of multiple memory cells. FIG. 3 illustrates an example of threshold voltage ranges and their distributions for a population of a sixteen-level memory cells, e.g., QLC memory cells. For example, such a memory cell can be programmed to a threshold voltage (Vt) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ can tend to have tighter distributions.

The threshold voltage ranges $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$, and $330_{15}$ can each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case can be storing a data state L0 having a data value of logical '1111' and is typically referred to as the erased state of the memory cell. If the threshold voltage is within the second of the sixteen threshold voltage ranges $330_1$, the memory cell in this case can be storing a data state L1 having a data value of logical '0111'. If the threshold voltage is within the third of the sixteen threshold voltage ranges $330_2$, the memory cell in this case can be storing a data state L2 having a data value of logical '0011,' and so on. Table 1 provides one possible correspondence between the data states and their corresponding logical data values. Other assignments of data states to logical data values are known or can be envisioned. Memory cells remaining in the lowest data state (e.g., the erased state or L0 data state), as used herein, will be deemed to be programmed to the lowest data state.

TABLE 1

| Data State | Logical Data Value |
|---|---|
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Figure 4:
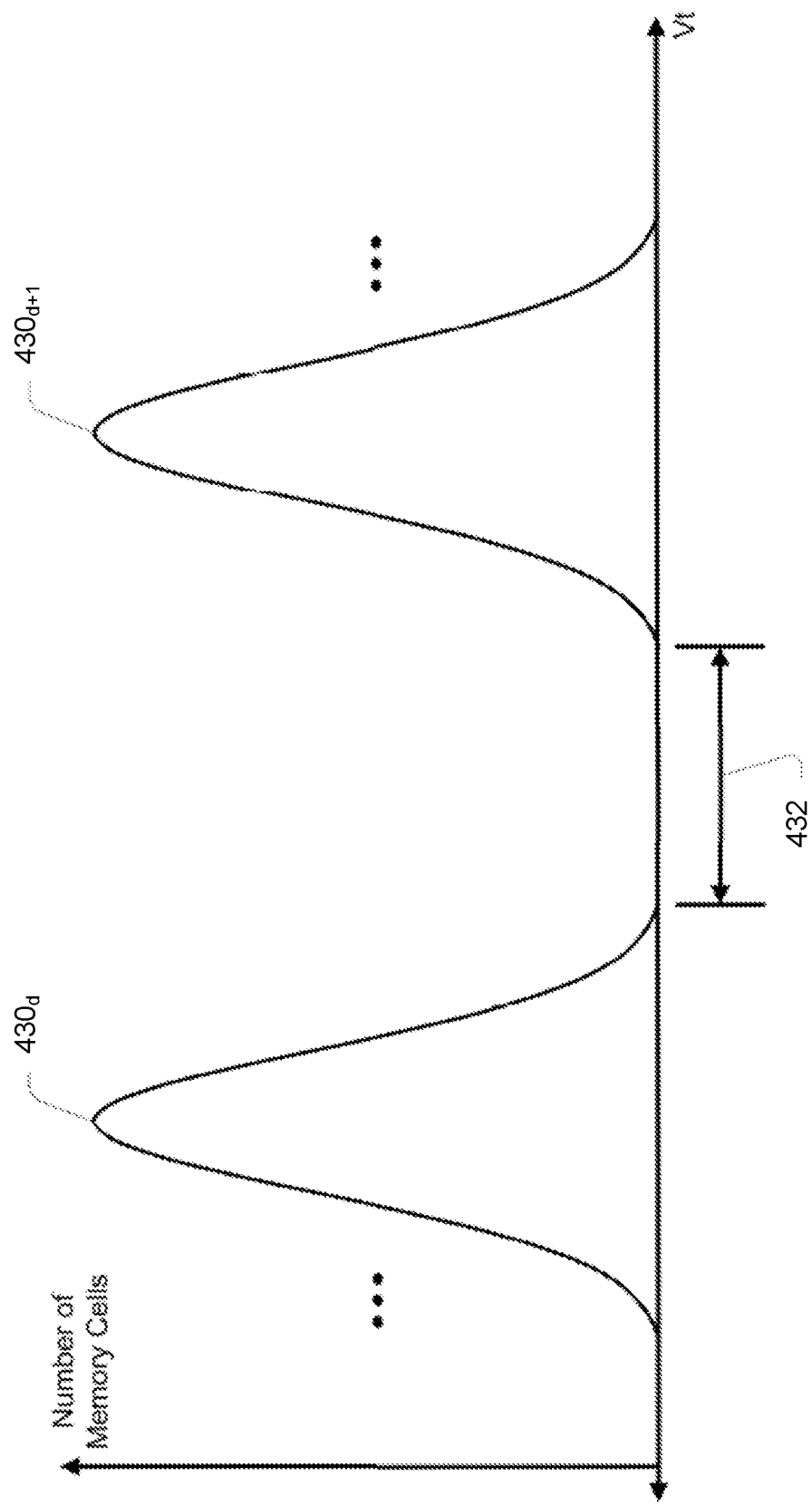
FIG. 4 is a conceptual depiction of a threshold voltage distribution of multiple memory cells at one stage following programming for use with various embodiments.

FIG. 4 is a conceptual depiction of a threshold voltage distribution of multiple memory cells following a programming operation. The threshold voltage distributions $430_d$-$430_{d+1}$ of FIG. 4 can represent some portion of the distributions for threshold voltage ranges $330_0$-$330_{15}$ of FIG. 3 at the completion of a programming operation for memory cells. With reference to FIG. 4, adjacent threshold voltage distributions 430 are typically separated by some margin 432 (e.g., dead space) at the completion of programming. Applying a sense voltage (e.g., read level voltage) within the margin 432 to the control gates of the multiple memory cells can be used to distinguish between the memory cells of the threshold voltage distribution $430_d$ (and any lower threshold voltage distribution) and the memory cells of the threshold voltage distribution $430_{d+1}$ (and any higher threshold voltage distribution).

Due to the phenomenon known as charge loss, which includes quick charge loss (QCL) and slow charge loss (SCL), the threshold voltage of a memory cell changes over time as the electric charge of the cell is degrades, which is referred to as "temporal voltage shift" (since the degrading electric charge causes the voltage distributions to shift along the voltage axis towards lower voltage levels as well as causing the margin 432 to narrow over time). Further, the QCL is caused by the threshold voltage changing rapidly at first (immediately after the memory cell was programmed), and then SCL takes over as the threshold voltage shift slows down in an approximately logarithmic linear fashion with respect to the time elapsed since the cell programming event. In various embodiments, this temporal voltage shift, if left unadjusted, reduces the read window margin 432 between the threshold voltage distributions $430_d$-$430_{d+1}$ over time, and can cause these threshold voltage distributions to overlap, making it more difficult to distinguish between adjacent threshold voltage distributions. Accordingly, failure to mitigate the temporal voltage shift caused by the slow charge loss can result in the increased bit error rate in read operations. Further, failure to mitigate the Vt shift across all Vt distributions due to the previously discussed back-pattern effect can cause increases in read errors, causing high read trigger rate, which in turn negatively impacts QoS.

Figure 5:
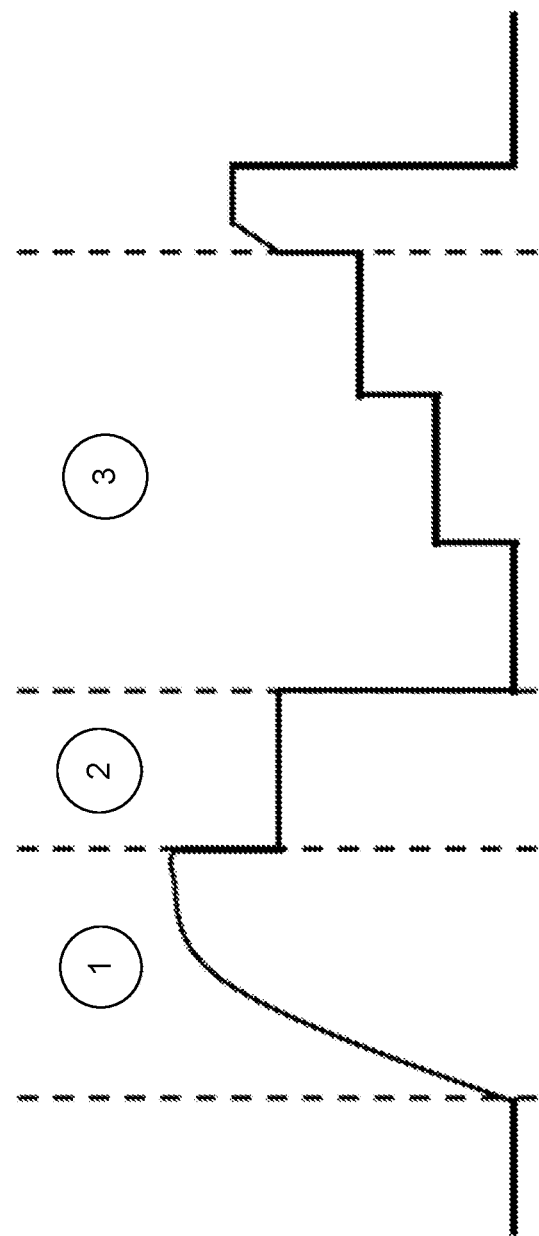
FIG. 5 is a of graph illustrating an example of consecutive phases of a read operation according to at least one embodiment.

FIG. 5 is a of graph illustrating an example of consecutive phases of a read operation according to at least one embodiment. During a first phase (1), a pass voltage (or "Vpass") is applied to the wordlines (WLs) of string(s) of an array of memory cells, e.g., the array of memory cells 200A or 200B (FIGS. 2A-2B). In various embodiments, a dynamic pass voltage trips at different values depending on the number of wordlines that are associated with memory cells that have been programmed.

More specifically, as the pass voltage increases on unselected wordlines in the first phase of FIG. 5, pillar current increases. In a fully programmed block, due to higher programmed threshold voltages (Vt) across programmed memory cells, the string current (Is) for a given pass voltage is relatively low. In a partially-programmed block, since some of the memory cells are in an erased state (for which the Vt of these memory cells is lower), the string current for a given pass voltage is higher. In a block that is just starting to be programmed, e.g., where only few memory cells have been programmed, the string current for a given pass voltage is much higher. Thus, pass voltage tripping works based on pillar or string current sensing within the memory device 130. In a fully programmed block, the pass voltage needs to get to a higher level to achieve tripping the string current, causing the pass voltage to trip at a higher voltage. In contrast, in a partially-programmed block, the pass voltage need not get very high to achieve the tripping of the string current, causing the pass voltage to trip at a lower voltage.

For example, FIG. 6A is a graph illustrating a typical memory array in which a pass voltage trip point is the same for many of the initial wordlines (WLs) associated with programmed memory cells and that increases rapidly with an increasing number of memory cells that are programmed according to at least one embodiment. As illustrated, the initial 20 WLs that are associated with programmed memory cells have close to the same low pass voltage trip point value. A pass voltage trip point is the voltage applied to the WL below which the memory cell would start to be programmed, which is not desired for unselected and unprogrammed memory cells during a read operation. Further, the more charge loss that a memory cell experiences, the greater the overdrive current the memory cells experience for a page of data, e.g., due to the amount of drop in Vt distributions relative to the relatively higher pass voltage applied to the WLs.

As additional memory cells are programmed, the pass voltage trip point values increase with the increasing number of associated WLs, as illustrated in the graph of FIG. 6A. Thus, the local media controller 135 (or control logic such as the partial block compensator 137) can correlate the pass voltage trip point with various buckets or ranges in terms of the number of WLs associated with memory cells that have been programmed. The horizontal dashed lines are examples of such ranges of WLs. In various embodiments, a first range is 0-15 WLs, a second range is 16-30 WLs, a third range is 31-60 WLs, a fourth range is 61-90 WLs, and so forth to increasing numbers of WLs associated with programmed memory cells. The ranges can be designed to be narrower in initially-programmed WLs and wider in later-programmed WLs. More fine-grained or less-granular ranges are also envisioned in varying embodiments, which can depend on the workload and architecture of memory device 130.

FIG. 6B is a graph illustrating results of the disclosed partial read block level voltage compensation in which the pass voltage trip point has better differentiation for respective WLs associated with the memory cells that are initially programmed according to an embodiment. As can be observed, the initial 20 or so WLs associated with programmed memory cells have better-differentiated pass voltage trip point values along a more gradual curve of pass voltage trip points.

In alternative embodiments, the controller 115 (e.g., processing device) of the memory sub-system 110 tracks the number of wordlines (WLs) of a block or string(s) that are associated with memory cells that have been programmed. This tracking can be as a percentage value of a total number of WLs of the block or string(s) that are associated with programmed memory cells. In this embodiment, the controller 115 can generate a read command associated with a feature address of the selected wordline that is to be read along with a value indicative of the number of WLs or the percentage of the number of WLs associated with programmed memory cells of the block or string(s). The memory device 130 receives the read command to include the feature address of the selected wordline and the percentage value associated with the number of wordlines within the array associated with programmed memory cells.

In various embodiments, once the number (or percentage) of WLs associated with programmed memory cells has been determined, the control logic of the memory device 130 adjusts the read voltage during phase three (3) of the read operation by applying an optimal read voltage offset to a read level voltage. The control logic can further cause, also during phase three (3) of the read operation, the adjusted read level voltage to be applied to the selected wordline, e.g., to perform sensing at the memory cell(s) associated with the selected wordline. The graph of FIG. 5 illustrates several read pulses applied, so the read voltage offset can be applied to one or more of the read voltages employed in phase three (3).

More specifically, in some embodiments, the control logic determines the number of WLs associated with programmed memory cells by detecting a pass voltage trip point value associated with a pass voltage applied to wordlines of the string(s) or block. In these embodiments, adjusting the read level voltage includes correlating the pass voltage trip point value to a range of multiple ranges of wordlines that are associated with memory cells that have been programmed. The control logic can then retrieve, from a data structure, a voltage offset corresponding to the range of WLs and adjust, using the voltage offset, an existing read level voltage to determine the adjusted read level voltage. This data structure can be a table, such as Table 2 (discussed later), that is stored in local memory, for example. This data structure can be populated with data that correlates the various buckets or ranges of the number of WLs to a voltage offset that is to be applied to the read level voltage.

Further, in the alternative embodiments, the control logic determines the number of WLs associated with programmed memory cells by receiving, from a processing device of the memory sub-system 110, a percentage value associated with the number of wordlines that are associated with programmed memory cells. For example, this percentage value can be received in a read command associated with a feature address of the selected wordline. In these embodiments, the control logic can then correlate the percentage value to a voltage offset that compensates for increased pillar current caused by unprogrammed memory cells of the one or more strings. The control logic can further adjust, using the voltage offset, an existing read level voltage to the adjusted read level voltage. More specifically, in at least some embodiments of phase one (1), the control logic correlates the percentage value to a first voltage offset that compensates for voltage shift corresponding to the number of wordlines in a partial block that are associated with programmed memory cells and causes a read calibration to be performed to determine a second voltage offset that compensates for a temporal voltage shift associated with selected wordline. In these embodiments, the control logic further combines the first voltage offset and the second voltage offset to determine a total voltage offset and adjusts, using the voltage offset, an existing read level voltage to generate the adjusted read level voltage.

In at least one other embodiment, the second phase (2) of the read operation further includes additional adjustments or calibration to the read level voltage of individual Vt distributions. For example, to adjust the read level voltage, the control logic may cause a first read calibration to be performed to determine a first voltage offset (or trim) corresponding to the number of wordlines in a partially-programmed block that are associated with programmed memory cells. The control logic can further cause a second read calibration to be performed to determine a second voltage offset that compensates for a temporal voltage shift associated with the selected wordline. The control logic can further combine the second voltage offset (that compensates for Vt distribution shift) and the first voltage offset (associated with the number of programmed WLs) to determine a total voltage offset, although additional voltage offsets can also be combined into the total voltage offset. The control logic can then adjust, using the total voltage offset, an existing read level voltage to generate the adjusted read level voltage.

In various embodiments, once the adjusted read level voltage is determined, the control logic can perform a parallel auto read-calibration (pARC) that is employed to locate the read window margins within the valleys between Vt distributions of a group of memory cells coupled with the selected wordline. In this way, a pARC-based calibration can be performed as well as part of the read operation after determining the total voltage offset to the read level voltage.

In some embodiments, the adjustment or calibration that generates the second voltage offset or trim value to compensate for temporal voltage shift of the selected memory cells does so based on a digital failed byte count (CFbyte) or a failed bit count (CFbit) of a group of memory cells. The control logic can determine a metadata value characterizing a read level voltage of a Vt distribution of a subset of a group of memory cells, where the metadata value is at least one of the digital CFbyte or CFbit. The failed byte count reflects (e.g., is equal to or is derived by a known transformation from) the number of bytes in the sensed data that have at least one non-conducting bitline, e.g., due to the Vt of associated memory cells being above a particular read threshold voltage. The failed bit count reflects (e.g., is equal to or is derived by a known transformation from) the number of non-conducting bitlines in the sensed data, e.g. due to the Vt of associated memory cells being above a particular read threshold voltage. As discussed, once the CFbyte or CFbit is known, its value can be correlated within, for example, a look up table to a read offset that can be used as the second voltage offset or trim value.

In some embodiments, a higher number of bytes/bits that are above the particular read threshold voltage translates to smaller temporal voltage shift and thus the second voltage offset would be smaller. In contrast, a lower number of bytes/bits that are above the particular read threshold translates in a higher temporal shift (e.g., more charge loss) and thus the second voltage offset would be higher to provide compensation for temporal voltage shift.

In a system-focused embodiment, the controller 115 (e.g., processing device) can perform the actual read level voltage adjustments. More specifically, the controller 115 can be configured to identify the number of wordlines of a block or string(s) of memory cells of the memory array that are associated with memory cells that have been programmed. The controller 115 can further determine a voltage offset corresponding to the number of wordlines and a read level voltage using the voltage offset. In some embodiments, the voltage offset is an optimal read voltage offset intended to compensate for the partial-programmed block condition of the memory array. The controller 115 can further generate the read command to include the read level voltage that incorporates the voltage offset (and optionally also to combine additional voltage offsets into a total voltage offset inserted into the read command). The controller 115 can further send the read command to the memory device that includes the read level voltage and an address of a selected wordline of the memory array that is to be read.

TABLE 2

| WL# Ranges | Read Voltage Offset |
| --- | --- |
| WL3-15 | −60 mV |
| WL16-30 | −50 mV |
| WL31-60 | −40 mV |
| WL61-91 | −30 mV |
| WL92-140 | −20 mV |
| WL141-180 | −10 mV |

In some embodiments, determining the voltage offset can include accessing a data structure in which ranges of the plurality of wordlines (WLs) that have been programmed are indexed against different voltage offsets and indexing, using the number of wordlines, within the data structure to determine the voltage offset. In some embodiments, the data structure is a table or the like such as illustrated in Table 2 only by way of example. Thus, for example, if a physical block has been programmed through wordlines numbered in the range of WL31-60, a −40 mV offset would be read out of the table. This approach of indexing within Table 2 assumes that programming is performed sequentially starting with the lowest-numbered wordline and working towards higher-numbered wordlines.

Further, to determine the read level voltage, the controller 115 can incorporate additional read level voltage calibration. To do so, the controller 115 can perform operations such as causing a first read calibration to be performed to determine a first voltage offset corresponding to the number of wordlines associated with programmed memory cells in a partially-programmed block. The operations can further including causing a second read calibration to be performed to determine a second voltage offset that compensates for a temporal voltage shift associated with the selected wordline. The operations can further include combining the first voltage offset and the second voltage offset to determine a total voltage offset. The operations can further include adjusting, using the total voltage offset, an existing read level voltage for the selected memory cell to determine an adjusted read level voltage.

FIG. 7 is a flow diagram of an example method 700 of performing partial block read level voltage compensation according to various embodiments. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the local media controller 135 (e.g., control logic) of FIGS. 1A-1B, e.g., by the partial block compensator 137, on a memory array that includes a memory cells electrically coupled to multiple wordlines and multiple bitlines. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the number of programmed WLs is determined. More specifically, the processing logic determines, prior to performing a read operation at one or more strings of memory cells of a memory array, the number of wordlines of the one or more strings that are associated with memory cells that have been programmed.

At operation 720, a read level voltage is adjusted. More specifically, the processing logic adjusts, based on the number of wordlines, a read level voltage for a selected wordline of the one or more strings that is to be read during the read operation. As discussed previously, this adjusting can also include other read level voltage adjustments, e.g., to compensate for temporal voltage shift or other read level voltage calibrations the processing logic might perform.

At operation 730, the adjusted read voltage is applied. More specifically, the processing logic causes, during the read operation, the adjusted read level voltage to be applied to the selected wordline.

Figure 8:
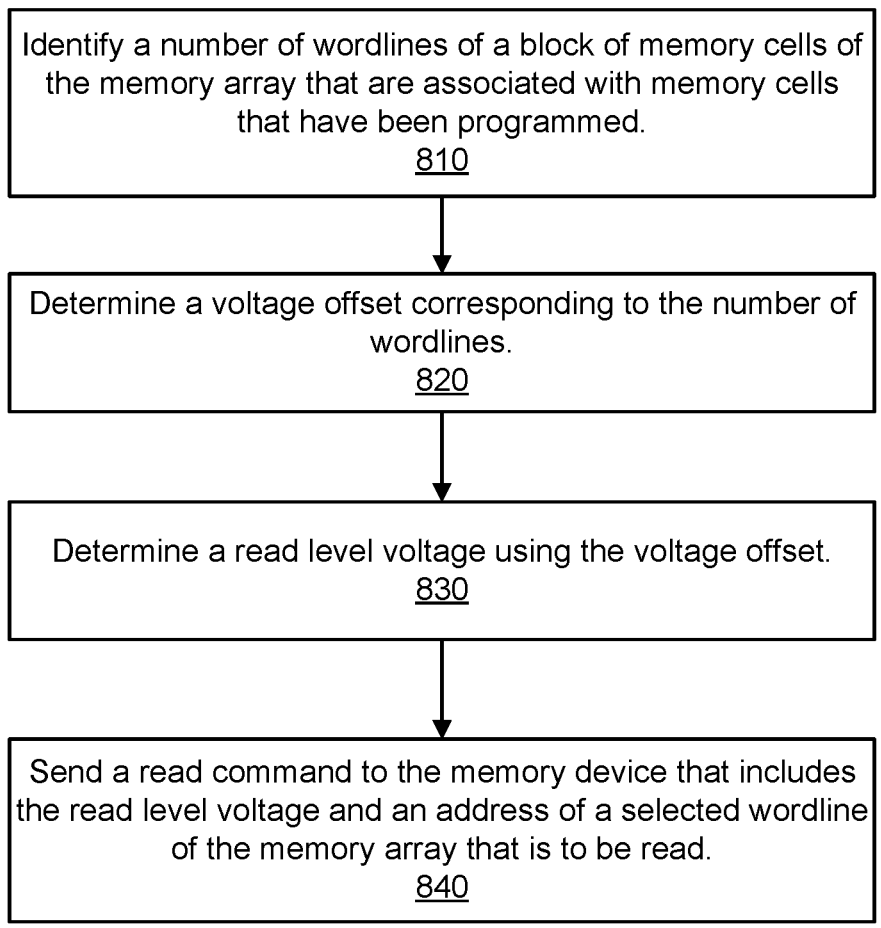
FIG. 8 is a flow diagram of an example method of performing partial block read level voltage compensation according to at least another embodiment.

FIG. 8 is a flow diagram of an example method of performing partial block read level voltage compensation according to at least another embodiment. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the local media controller 135 (e.g., control logic) of FIGS. 1A-1B on a memory array that includes memory cells electrically coupled to multiple wordlines and multiple bitlines. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the number of programmed WLs is determined. More specifically, the processing logic identifies the number of wordlines of a block of memory cells of the memory array that are associated with memory cells that have been programmed.

At operation 820, a voltage offset is determined. More specifically, the processing logic determines a voltage offset corresponding to the number of wordlines.

At operation 830, a read level voltage is determined. More specifically, the processing logic determines a read level voltage using the voltage offset, At operation 840, a read command is sent. More specifically, the processing logic sends a read command to the memory device that includes the read level voltage and an address of a selected wordline of the memory array that is to be read. The read command can further include valley track information as well or contain a read level voltage that is further calibrated for temporal voltage shift or other calibration determined by the controller 115.

Figure 9:
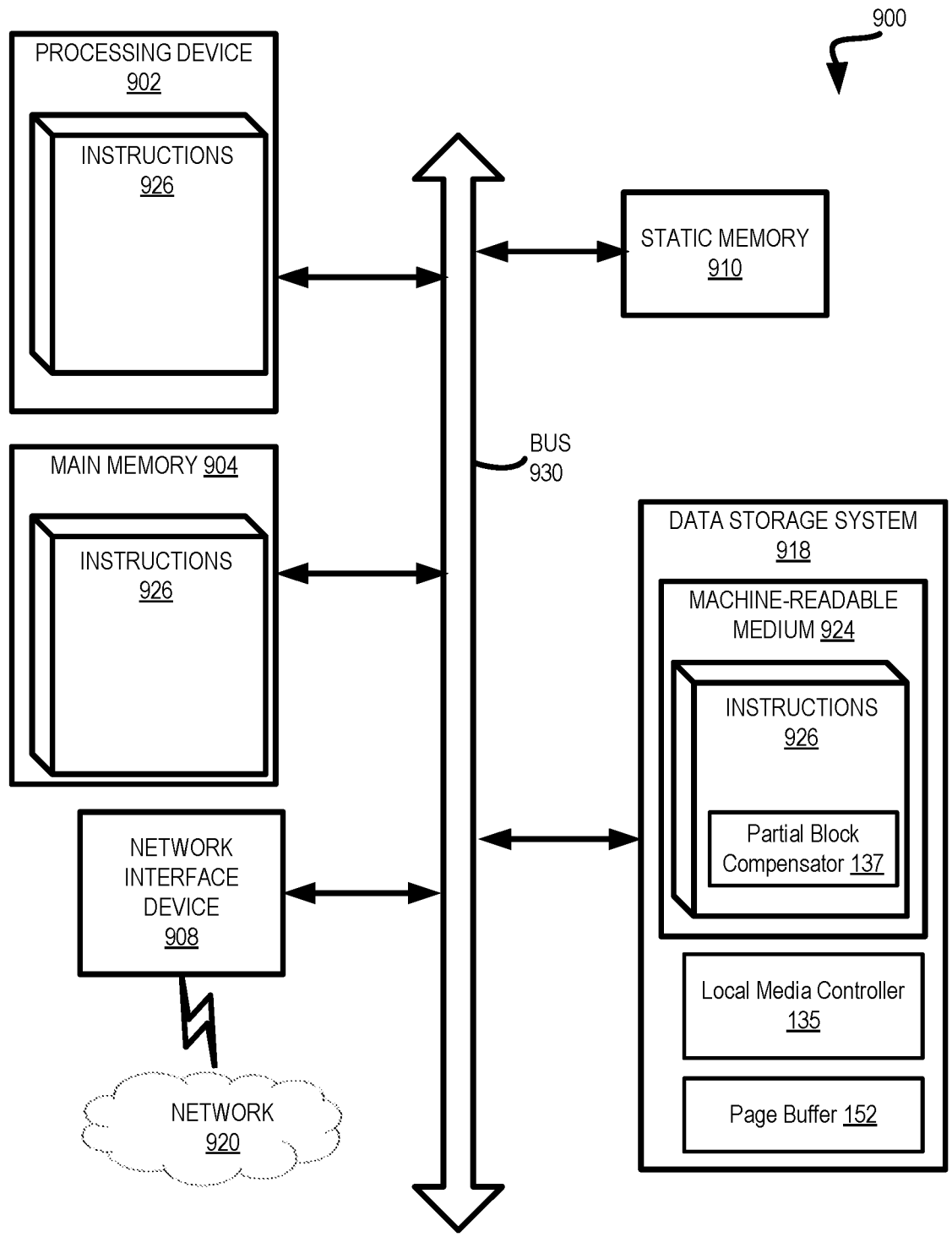
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 910 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 928 for performing the operations and steps discussed herein. The computer system 900 can further include a network interface device 912 to communicate over the network 920.

The data storage system 918 can include a machine-readable storage medium 924 (also known as a non-transitory computer-readable storage medium) on which is stored one or more sets of instructions 926 or software embodying any one or more of the methodologies or functions described herein, including those associated with the partial block compensator 137. The data storage system 918 can further include the local media controller 135 and the page buffer 152 that were previously discussed. The instructions 928 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1A.

In one embodiment, the instructions 926 include instructions to implement functionality corresponding to a controller (e.g., the memory sub-system controller 115 of FIG. 1A). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising a plurality of wordlines coupled with respective memory cells of the memory array; and
   control logic operatively coupled with the memory array, the control logic to perform operations comprising:
      determining, prior to performing a read operation at one or more strings of the respective memory cells, a number of wordlines that are associated with memory cells that have been programmed, wherein the determining comprises detecting a pass voltage trip point value associated with a pass voltage applied to wordlines of the one or more strings;
      adjusting, based on the number of wordlines, a read level voltage for a selected wordline of the one or more strings that is to be read during the read operation; and
      causing, during the read operation, the adjusted read level voltage to be applied to the selected wordline.

2. The memory device of claim 1, wherein the memory cells of the one or more strings have been partially programmed such that at least some of the memory cells are in an erased state.

3. The memory device of claim 1, wherein the adjusting comprises:
   correlating the pass voltage trip point value to a range of a plurality of ranges of the plurality of wordlines that are associated with the memory cells that have been programmed;
   retrieving, from a data structure, a voltage offset corresponding to the range; and
   adjusting, using the voltage offset, an existing read level voltage.

4. The memory device of claim 1, wherein the adjusting comprises:
   causing a first read calibration to be performed to determine a first voltage offset corresponding to the number of wordlines in a partially-programmed block;
   causing a second read calibration to be performed to determine a second voltage offset that compensates for a temporal voltage shift associated with the selected wordline;
   combining the first voltage offset and the second voltage offset to determine a total voltage offset; and
   adjusting, using the total voltage offset, an existing read level voltage to generate the adjusted read level voltage.

5. The memory device of claim 1, wherein the determining comprises receiving, from a processing device of a memory sub-system, a percentage value associated with the number of wordlines.

6. The memory device of claim 5, wherein the percentage value is received in a read command associated with a feature address of the selected wordline.

7. The memory device of claim 5, wherein the adjusting comprises:
   correlating the percentage value to a first voltage offset that compensates for voltage shift corresponding to the number of wordlines in a partial block;
   causing a read calibration to be performed to determine a second voltage offset that compensates for a temporal voltage shift associated with selected wordline;
   combining the first voltage offset and the second voltage offset to determine a total voltage offset; and
   adjusting, using the voltage offset, an existing read level voltage to generate the adjusted read level voltage.

8. A method comprising:
   determining, prior to performing a read operation at one or more strings of memory cells of a memory array, a number of wordlines of the one or more strings that are associated with memory cells that have been programmed, wherein the determining comprises detecting a pass volatage trip point value associated with a pass voltage applied to wordlines of the one or more strings;
   adjusting, based on the number of wordlines, a read level voltage for a selected wordline of the one or more strings that is to be read during the read operation; and
   causing, during the read operation, the adjusted read level voltage to be applied to the selected wordline.

9. The method of claim 8, wherein memory cells of the one or more strings have been partially programmed such that at least some of the memory cells are in an erased state.

10. The method of claim 8, wherein the adjusting comprises:
    correlating the pass voltage trip point value to a range of a plurality of ranges of the number of wordlines of the memory array that are associated with the memory cells that have been programmed;
    retrieving, from a data structure, a voltage offset corresponding to the range; and
    adjusting, using the voltage offset, an existing read level voltage.

11. The method of claim 8, wherein the adjusting comprises:
    causing a first read calibration to be performed to determine a first voltage offset corresponding to the number of wordlines in a partially-programmed block;
    causing a second read calibration to be performed to determine a second voltage offset that compensates for a temporal voltage shift associated with the selected wordline;
    combining the first voltage offset and the second voltage offset to determine a total voltage offset; and
    adjusting, using the total voltage offset, an existing read level voltage.

12. The method of claim 8, wherein the determining comprises receiving, from a processing device of a memory sub-system, a percentage value associated with the number of wordlines.

13. The method of claim 12, wherein the receiving comprises receiving the percentage value in a read command associated with a feature address of the selected wordline.

14. The method of claim 12, wherein the adjusting comprises:
    correlating the percentage value to a first voltage offset that compensates for voltage shift corresponding to the number of wordlines in a partial block;
    causing a read calibration to be performed to determine a second voltage offset that compensates for a temporal voltage shift associated with selected wordline;
    combining the first voltage offset and the second voltage offset to determine a total voltage offset; and
    adjusting, using the voltage offset, an existing read level voltage to generate the adjusted read level voltage.

15. A memory sub-system comprising:
    a memory device comprising a memory array comprising a plurality of wordlines coupled with respective memory cells of the memory array; and
    a processing device coupled with the memory device, the processing device to perform operations comprising:
        identifying a number of wordlines of a block of memory cells of the memory array that are associated with memory cells that have been programmed;
        determining a voltage offset corresponding to the number of wordlines;
        determining a read level voltage using the voltage offset; and
        sending a read command to the memory device that includes the read level voltage and an address of a selected wordline of the memory array that is to be read.

16. The memory sub-system of claim 15, wherein the determining the voltage offset comprises:
    accessing a data structure in which ranges of the plurality of wordlines that have been programmed are indexed against different voltage offsets; and
    indexing, using a value representing the number of wordlines, within the data structure to determine the voltage offset.

17. The memory sub-system of claim 15, wherein determining the read level voltage comprises:
    causing a first calibration to be performed to determine a first voltage offset corresponding to the number of wordlines in a partially-programmed block;
    causing a second read calibration to be performed to determine a second voltage offset that compensates for a temporal voltage shift associated with the selected wordline;
    combining the first voltage offset and the second voltage offset to determine a total voltage offset; and
    adjusting, using the total voltage offset, an existing read level voltage to be applied to the selected wordline.

18. The memory sub-system of claim 15, wherein the operations further comprise generating the read command to include the read level voltage that incorporates the voltage offset.

* * * * *